(12) United States Patent
Thompson et al.

(10) Patent No.: US 7,172,785 B2
(45) Date of Patent: *Feb. 6, 2007

(54) PROCESS FOR DEPOSITION OF METAL ON A SURFACE

(76) Inventors: G. Alan Thompson, 3 Woodburn Drive, Gloucester, Ontario (CA) K1B 3A6; Theresa M Anderson, 1054 Concassion Street, P.O. Box 146, Russell, Ontario (CA) K4R 1C8; David E. Marx, 605 Timber La., Clark's Summit, PA (US) 18411

( * ) Notice: Subject to any disclaimer, the term of this patent is extended or adjusted under 35 U.S.C. 154(b) by 0 days.

This patent is subject to a terminal disclaimer.

(21) Appl. No.: 10/332,922

(22) PCT Filed: Jul. 11, 2001

(86) PCT No.: PCT/CA01/01015

§ 371 (c)(1),
(2), (4) Date: Jul. 7, 2003

(87) PCT Pub. No.: WO02/06561

PCT Pub. Date: Jan. 24, 2002

(65) Prior Publication Data

US 2004/0022957 A1 Feb. 5, 2004

Related U.S. Application Data

(60) Provisional application No. 60/218,060, filed on Jul. 13, 2000.

(30) Foreign Application Priority Data

Apr. 6, 2001 (CA) .................................. 2343440

(51) Int. Cl.
*B06B 1/20* (2006.01)
*B05D 1/18* (2006.01)
*B05D 3/10* (2006.01)

(52) U.S. Cl. ..................... 427/2.31; 427/601; 427/304; 427/443.1

(58) Field of Classification Search ................ 427/600, 427/601, 2.31, 322, 304, 305, 306, 430.1; 428/457, 458

See application file for complete search history.

(56) References Cited

U.S. PATENT DOCUMENTS 2,744,860 A * 5/1956 Rines .......................... 205/137
3,733,213 A * 5/1973 Jacob .......................... 427/328

(Continued)

FOREIGN PATENT DOCUMENTS

DE            3905100         8/1990

(Continued)

*Primary Examiner*—Katherine Bareford
(74) *Attorney, Agent, or Firm*—Borden Lander Gervais LLP (57) ABSTRACT

The invention relates to a process for depositing a metal on a material. The process comprises the steps of: immersing the material in deposition solution comprising the metal; inducing a material vibration in the deposition solution having a frequency corresponding to a resonance frequency of the material; including a solution vibration in the deposition solution in a direction non-parallel to the material vibration, said solution vibration having a frequency corresponding to the a resonance frequency of the deposition solution, whereby said metal is deposited onto the material. This process results in deposition of metal from the plating bath on the material in a controlled and substantially uniform thickness.

13 Claims, 3 Drawing Sheets

U.S. PATENT DOCUMENTS

| | | | |
|---|---|---|---|
| 3,854,890 A * | 12/1974 | Akamatsu | 428/601 |
| 3,925,138 A * | 12/1975 | Shaul et al. | 156/313 |
| 4,528,265 A | 7/1985 | Becker | |
| 4,592,808 A * | 6/1986 | Doubt | 205/102 |
| 4,728,323 A | 3/1988 | Matson | |
| 4,960,413 A | 10/1990 | Sagar et al. | |
| 5,024,858 A | 6/1991 | Burch | |
| 5,279,899 A | 1/1994 | Asrar | |
| 5,374,283 A | 12/1994 | Flick | |
| 5,399,382 A | 3/1995 | Burch et al. | |
| 5,814,094 A | 9/1998 | Becker et al. | |
| 6,033,622 A * | 3/2000 | Maruyama | 419/35 |
| 6,087,549 A | 7/2000 | Flick | |
| 6,333,093 B1 * | 12/2001 | Burrell et al. | 428/194 |
| 6,368,482 B1 | 4/2002 | Oeftering et al. | |
| 6,726,964 B1 * | 4/2004 | Thompson et al. | 427/600 |
| 6,861,570 B1 * | 3/2005 | Flick | 602/41 |

FOREIGN PATENT DOCUMENTS

| | | |
|---|---|---|
| DE | 4111174 | 10/1992 |
| DE | 4322378 | 1/1995 |
| EP | 0 915 182 A1 * | 5/1999 |
| JP | 02023697 | 1/1990 |

* cited by examiner

A ⬡ MATERIAL TRANSDUCER ARRAYS
B ▢ SOLUTION TRANSDUCER ARRAYS
)))) WAVES

R ⓡ ROLLERS
M ⓜ MATERIAL
—·— DIRECT WAVE
----- REFLECTED WAVE
——— FLUID LEVEL

FIG. 5A

A ⬡ MATERIAL TRANSDUCER ARRAYS
B ▢ SOLUTION TRANSDUCER ARRAYS
)))) WAVES

—·— DIRECT WAVE
----- REFLECTED WAVE
——— FLUID LEVEL

FIG. 5B

PROCESS FOR DEPOSITION OF METAL ON A SURFACE

CROSS REFERENCE TO RELATED APPLICATION

This application is a national stage of PCT/CA01/01015 filed Jul. 11, 2001, and based upon U.S. Provisional application Ser. No. 60/218,060 filed Jul. 13, 2000, and Canadian application 2,343,440 filed Apr. 6, 2001 under the International Convention.

FIELD OF THE INVENTION

The present invention relates generally to a process for deposition of metal onto the surface of material.

BACKGROUND OF THE INVENTION

There are many problems to be overcome in the metalizing of materials. Some of the conventional methods for metalizing include electrolytic, sputtering and autocatalytic processes. Such conventional methods may result in uneven coating, clumping and flaking of the metal deposited on the material. Autocatalytic baths often have "dead zones" within the bath solution, where no metal application occurs.

In the field of medicine, the aerospace industry, and for other industrial applications, it is desirable to provide a process for deposition of metals onto a material that results in an even application of metal onto the material. Without stringent control of the thickness of a metallic coating, large quantities of metal may be wasted by applying an excessively thick layer, or the effectiveness of a metal layer may be reduced if an area of thin application results. With such problems as these, it is difficult to achieve adequate quality control using prior art metalizing methods.

Silver has been used in the field of medicine to promote wound healing. U.S. Pat. No. 5,814,094 issued Sep. 29, 1998 to Becker et al., describes a system involving direct application of silver to a wound to promote wound healing. U.S. Pat. No. 4,960,413, issued Oct. 2, 1990 to Sagar et al., describes a wound dressing assembly which includes silver as an anti-bacterial agent. U.S. Pat. No. 4,728,323, issued Mar. 1, 1988 to Matson, describes an antimicrobial wound dressing comprising a substrate, such as a bandage, coated with an antimicrobially effective film of a silver salt. Deposition of silver onto nylon or other medical grade fabric using conventional autocatalytic methods may result in areas of the fabric having greater or less than the intended amount of silver coated thereon. An uneven silver coating is undesirable for medicinal quality silver coated bandages. There is a need for a process that results in a relatively thin and uniform application of metal ions, such as silver, to a substrate such as wound dressing materials.

In order to guarantee a minimum deposition of silver onto material, such as wound care dressings, according to conventional autocatalytic methods, it is necessary to increase the concentration of silver in solution. This ultimately increases the overall cost of processing the material. Further, an increase in the concentration of silver in solution can result in clumping and scaling of silver, and may cause voids or gaps in silver deposition. To guarantee a minimum coverage of silver onto material it is necessary to increase the time the material is exposed to a conventional autocatalytic solution. This results in a reduction in the amount of material processed per hour, which affects processing price accordingly.

The aerospace industry uses metals and metalized fabrics for impedance, resistance, RF resonance, RFI—EMI shielding, conductivity levels, low observability applications, thermal signature reduction and transfer, and infrared signature reduction requirements. Parasitic metals, such as copper foil, are presently in use in aerospace applications. Parasitic metals significantly increase the weight of an aircraft. Metalized materials produced by conventional autocatalytic processes do not produce the conductivity levels desired by the industry. Work hardening may also be a problem when applying metal to a flexible component using prior art methodology.

It is, therefore, desirable to provide a process for deposition of metals onto a material that results in a uniform and controlled application of metal onto the material.

SUMMARY OF THE INVENTION

It is an object of the present invention to obviate or mitigate at least one disadvantage of previous processes for metal deposition.

The invention provides a process for depositing a metal on a material comprising the steps of: immersing the material in a deposition solution comprising the metal; inducing a material vibration in the deposition solution having a frequency corresponding to a resonance frequency of the material; inducing a solution vibration in the deposition solution in a direction non-parallel to the material vibration, said solution vibration having a frequency corresponding to the a resonance frequency of the deposition solution, whereby said metal is deposited onto the material.

Advantageously, metal ions are deposited evenly onto the material using this process. Further, the invention provides metalized materials, and in particular, silverized materials, including metalized polymers.

Advantageously, the invention provides a process which promotes control of the transfer rate of a metal, such as ionic silver, onto sensitized material in such a manner that permits uniform deposition of the metal, thus controlling the depositional thickness and reducing the occurrence of scaling and clumping. The inventive process also permits the effective de-gassing of the autocatalytic medium, eliminating problems associated with depositional voids. In turn, the thickness and quality of the metal deposition on the material, such as nylon, controls the level of conductivity designated for the end product. Sensitized material is set in motion in a direction non-parallel to the motion of the solution. The material is vibrated by the material transducer, while the solution is vibrated by a solution transducer. Consequently, the material and the solution are in a constant and controlled motion, the non-parallel direction of the two motions imparted are such that they flow toward each other. This eliminates depletion zones within the autocatalytic solution. Thus, when a sensitized material is drawn through the metal solution at a controlled rate, a constant deposition of metal is applied to the material.

According to the inventive process described herein, the use of sound wave vibrations in one or more of the processing solutions, set to the resonance frequency of the material results in the de-gassing of the material and the solution, promotes an even exposure of the material to the solution, and results in an even deposition of metal onto the material. Advantageously, the use of sound waves in this manner permits the metal in the solution to be depleted at a uniform and controllable rate. This allows for better control over the use of processing chemicals, the processing budget, and uniformity of the metal deposited onto the material. Advantageously, by drawing the material through the processing solution(s) at a predicted rate, the quality assurance and the rate of production per hour can be controlled.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Embodiments of the present invention will now be described, by way of example only, with reference to the attached Figures.

DETAILED DESCRIPTION

The present invention provides a process for depositing metal ions onto a material in such a way that allows control over deposition rate, and results in an even application of the metal.

The terms "resonance frequency", "resonant frequency" and "resident frequency" are used interchangeably herein to refer to the frequency at which a system reaches a maximum oscillation response when driven by an external driving force. In the case of the invention, oscillation is induced in the material on which the metal is to be deposited, as well as in a processing solution. Waves induced in one or more of the processing solutions during the metal deposition process are induced at a frequency that can be adjusted to the resonance frequency of the system.

The term "transducer" as used herein refers to a device that converts a signal from one form of energy to another. In particular, transducers are used in this invention to create physical vibrations within a fluid solution, or on the material that is to be metalized.

The terms "sensitized material" or "sensitization" as used herein refer to the process through which a surface of a material is prepared to receive a metal. The sensitization process can be conducted in an aqueous bath using chemical means to prepare the surface of a material, but could also be conducted in another way resulting in the same effect of preparing the surface of a material to receive a metal. The term "activation" as applied to a surface can also be used herein to mean sensitization.

The terms "sound waves", and "sound signalization", and "sound frequency" as used herein refer to acoustic energy vibrations at frequencies in the sub-sonic, sonic and ultrasonic ranges. A typical "sound frequency" may be approximately 20,000 hertz (20 kHz). A range of frequencies can be used with the invention which are in the sub-sonic, sonic, or ultrasonic region, for example, from about 5 to 2000 kHz, or more preferably from 5–150 kHz. No upper-limit on the ultrasonic frequencies to be used according to the invention is required. In instances where the terms sub-sonic, sonic, and ultrasonic are used, these terms refer to frequencies either above 20 kHz (ultrasonic) at about 20 kHz (sonic), or less than 20 kHz (sub-sonic).

According to the invention, a phase shifted resonant frequency vibration is accomplished through the use of a signal generation systems with a frequency spectrum that produces a mechanically induced wave set tuned to the resonant frequency of vibration of the material. The resonant frequency of the material depends on the various thread diameters and densities of the material as immersed in or drawn through a solution, as well as the solution properties. The resonant frequency can be determined in advance for a particular material by arranging a particular material within a tank and inducing waves of various frequencies therein, until the frequency causing maximum vibration is accomplished. The process results in a material having a sinusoidal undulating wave motion within an autocatalytic solution. This can be visibly observed in most cases, but could also be determined by other means known in the art. The sound vibration permits a more efficient transfer of metallic ions onto a material. Vibration of the material contributes to the controlled rate of ionic deposition and to uniform depletion of the autocatalytic medium. The resulting metal deposition is a non-porous void deposition on material.

The inventive process allows for a controlled depositional transfer rate of metallic ions uniformly onto material drawn through an autocatalytic solution. Variances in the cross-sectional density of the material can be dealt with by adjusting the wavelength, pulse width, amplitude, power level variability in the sonic signalization.

The variables will be reactive to the resonance vibration inherent to the metallic ion solution properties. When combined, the vibrations permit an effective and controllable ionic autocatalytic transfer from the solution onto the sensitized material.

The inventive process enables enhanced and/or total de-gassing of all solutions used in autocatalytic and electrolytic processes beginning with the stripping, and sensitizing solutions to the final end product neutralizing and rinse stages.

The inventive process is an improvement over conventional autocatalytic metal depositional processes in that it employs sound vibrations. A first vibration frequency is tuned to produce mechanically induced wave sets at the resonant frequency vibration of the material to be metalized. Thus, this first frequency of vibration is particular to such parameters as thread diameter, and the density of the material drawn through the auto-catalytic processing solutions. In a non-parallel direction to the material wave, for example, in a perpendicular direction, is another frequency vibration tuned to produce a mechanically induced wave set at the resonant frequency of vibration of a solution bath used in the auto-catalytic process. The solution vibration produced by the solution transducer, may be used in any or all processing baths to enable de-gassing of autocatalytic solutions, thereby eliminating problems associated with depositional voids.

A process for depositing a metal on a material according to an embodiment of the invention comprises the steps of: connecting a signal generator to a first transducer and a second transducer, placing the material in an autocatalytic plating bath comprising the metal, and coupling the first transducer to the plating bath. The second transducer is coupled to the material, and the first transducer is driven with the signal generator, applying a first vibratory signal to the plating bath using the first transducer. The second transducer is driven with the signal generator; and a second vibratory signal is applied to the material using the second transducer, set to the resonance frequency of the plating bath.

The Material. The material on which metal ions may be deposited may be any material capable of being coated. The material may be a non-conductive surface for autocatalytic applications, or may be a surface conducive to electrolytic applications. Exemplary materials include polymeric materials, such as polypropylene, polyethylene, polyurethane, nylon, polyacrylamide or other acrylamides, polymeric composites, copolymers, resins, woven, non-woven, film, melt-blown, or molded components. The material may be, for example, nylon, a Kevlar™ fabric (an aramid), Kevlar™ thread, other Kevlar™ type products (e.g. Zylon™, etc.), Nomex™ or composites of aramid or aramid-like materials. Carbon fiber, graphite, or other carbon-based materials, fiberglasss or other types of glasses, and other structural materials may also be used as the material onto which metal is deposited according to the invention. The material may also be synthetic or natural, organic or inorganic. Natural organic fibers, including biodegradable materials, cellulosic and/or protein fibers. The material may be in the form of a fabric, a fiber, a film, chopped or flocculated fiber, a woven or a non-woven.

Exemplary surfaces onto which metals may be applied include bandages or wound dressings, fabrics for forming clothing, interior or exterior structural components of aircraft, electronic components, ship infrastructure and superstructure, and satellite components.

In the case where the material to be coated is a knit fabric, the knit may either be sheer knit, such as a light nylon material, a heavy knit, which is a denser material than the sheer knit, a jersey knit, or any other kind of knit. The conditions, such as time, temperature, solution concentrations, etc. required for adequate deposition of metal may be adjusted to accommodate different knits, or deniers of thread. A material fabric to be metalized according to the invention may be provided as, for example, a 1 inch wide shear knit, a ½ inch wide tube knit, a straight web of 60 inches in width, or any other type of fabric. A heavier knit may require increased power or amplitude of the ultrasound emitted by the transducers. Further, in order to reach resonant frequency, as a general rule of thumb, a higher frequency is required for a lighter material.

Prior to silver deposition on an aramid material such as Kevlar™, etching may be conducted as a pre-treatment on the material surface using any known method, such as for example, the method of Burch, et al., described in U.S. Pat. No. 5,024,858, issued Jun. 18, 1991.

The Metal. The metal to be deposited onto materials using the inventive process may be any metal which is desirable to coat on a surface. For example, the metal can be selected from the group consisting of silver, tin, gold, platinum, copper, cobalt, palladium, cadmium, nickel, titanium, zinc, or other metals.

The Process. The process involves various steps, some of which are known in the art of autocatalytic or electrolytic plating. The steps include a washing step, a sensitizing step, and a deposition step. Rinsing between steps is conducted as required, and in some applications, many rinses are conducted between steps so as not to contaminate a bath with the content of the previous bath.

It is important to various embodiments of the invention that the material be kept moist as it proceeds through the various stages of the process, from cleaning to sensitization and plating. Squeeze suction may be used between baths to remove as much of the liquid from the previous bath as possible before proceeding into a wash or a subsequent bath.

The Washing Step. The washing step is required to remove oils or other particulate from the material to be metalized. This step occurs by immersing the material in a washing bath that contains a washing solution. The washing solution is usually aqueous and includes a surfactant, but may be any liquid solution, either aqueous or non-aqueous, that is capable of removing the contaminants from the material. For example, a non-polar organic solvent may be used to remove contamination that is soluble in a non-polar solvent, and a polar non-aqueous solvent can also be used, such as an alcohol. Inducement of sound waves into this bath may optionally be used, but is not necessary for the invention. If sonic signalization is incorporated into this bath, the washing step is advantageously made more thorough, or can be conducted in a shorter period of time. The washing may be conducted at any suitable temperature, for example, a temperature ranging from 20–60° C. If the material contains a great deal of dirt, oil or particulate, the use of a higher temperature, such as for example 35° C. is advantageous. The washing step also serves to wet the material. After immersing the material in the washing bath, if subsequent washes are required, they are conducted as necessary. As part of the washing step, a deionized water rinse is conducted to remove the washing solution from the material before proceeding to the sensitizing step. Excess washing solution and/or deionized water maybe removed from the material, for example by using squeeze rollers, as required.

The Sensitizing Step. The sensitizing step is then conducted. This step may also be referred to herein as the "activation" step. The washed material is then immersed in a bath containing a sensitizing solution. The sensitizing solution is one that prepares the material to receive a metal. The sensitizing step may be conducted at any acceptable temperature, suited to a particular application, for example at a temperature ranging from 20–35° C. Advantageously, if the temperature of the sensitizing solution is maintained below 35° C., the fuming of the solution is kept to a minimum. An exemplary temperature is 30° C. Lower temperatures may require a longer exposure to the sensitizing solution than would be needed to achieve the same level of sensitization at a higher temperature. Thus, the lower the temperature, the longer a material may be required to remain in the sensitizing bath. The viscosity of the solution is reduced at higher temperatures, which may be advantageous to the speed with which the material becomes adequately sensitized.

According to an embodiment of the invention, the sensitizing step may be conducted at a low pH, ranging for example from 0.5 to 1.5. Sound signalization may advantageously be induced into the sensitizing solution, but this is not necessary to the invention. As part of the sensitization step, rinsing may be required to remove excess sensitizing solution from the material before proceeding to the deposition step. For example, washing the material three times with deionized water, and holding the material in the last rinse should be adequate to rinse out the sensitizing solution.

During the sensitizing step, or any of the other steps as required, beads of polyethylene or resin particulate can be used in the solution to reduce evaporation and air exposure at the surface of the tank. Such beads or particulate can be used to enhance quality control.

The Deposition Step. The deposition step is conducted on the washed and sensitized material. This step involves immersing the material in a tank, or a "deposition tank" into which sound signalization is induced at a frequency corresponding to the resonance frequency of the material to be metalized. The tank contains a deposition solution, which contains the metal to be deposited onto the material. This deposition solution can be similar to autocatalytic metal deposition solutions known in the art. The sound wave frequencies are described in more detail below. The temperature of the deposition solution may be any temperature which allows deposition of metal, for example, from 5–60° C. A preferable range is from 30–45° C., and more preferably, a temperature from 32–40° C. is used. The material is immersed in the tank or conveyed therethrough for a set period of time, as determined by the amount of metal deposition required for a particular application. The deposition step further involves a "stop" bath or a rinsing, that has the effect of ending the metal deposition. This stop bath may comprise a rinse with deionized water at a temperature that may be similar to or higher than the temperature of the deposition bath. Advantageously, temperature shock can be avoided by conducting the stop bath at a temperature similar to or slightly higher than the deposition bath. As an exemplary rinsing, the material may be rinsed in deionized water three times at 35° C., so as to remove the deposition solution from the material. Drying of the material can also occur, for example by air drying, suction, or any conventional means of drying.

The term "plating bath", is used interchangeably herein to mean the deposition bath. The plating bath can be autocatalytic or electrolytic. Factors within the plating bath influence the amount of deposition. For example, by varying the temperature of the bath and concentrations of chemicals or metal within the bath, the amount of metal deposited on the surface will change. The optimization of parameters can be easily determined by one of skill in the art. The tank in which the deposition bath is contained may be shrouded in an inert gas during the deposition (or plating process), if it is advantageous to the end product so produced.

The deposition solution contains the metal to be deposited on the surface, preferably in the form of a metal salt. In the case of silver, a silver(I) salt can be used, for example, silver nitrate. A reducing agent can be present in the deposition solution, which may be selected from formaldehyde, hydrazine sulfate, hydrazine hydrate, glucose, and hypophosphoric acid. The reducing agent is present in a concentration sufficient to reduce the metal ions to metallic form. Further, a stabilizing agent may be present in the deposition solution, which may be selected from ammonium hydroxide, sodium acetate, sodium hydroxide and sodium citrate. The stabilizing agent may be present in sufficient concentration to prevent the reduction of metal ions, for example silver(I) ions, spontaneously in the deposition solution. An anionic surfactant, such as ammonium or sodium lauryl sulfate, may be present in the deposition solution if required. The anionic surfactant may be used in sufficient concentration to meet the critical micelle concentration of the surfactant and permit deposition of the metal onto the surface.

Conveying Material Between Tanks and Through a Tank. The material can be moved through any or all of the baths, in either "batch mode", or continuously for example by moving the material through the tank on rollers. Thus, the material may be fed into a bath from a roll, and removed therefrom on a take-up roll.

The baths used according to the process may be conducted in tanks which contain a plurality of rollers, such as a rack or rollers, disposed either centrally or at the lower end thereof. The rollers can be place in any or all baths, and also between baths, so that the speed of the rollers can be synchronized as a material is put through the process. The rollers may be formed of a webbed substance so that contact with the roller does not impede contact of the solution with the material being conveyed on a roller. For example, a roller may be formed of a woven, blown or extruded polymer. The roller system may be set up in any way that allows conveyance of material, for example a synchronized drive may be located to move rollers at the top of a roller system, with a free wheel at the bottom allowing corresponding rotation of the lower rollers.

The Tank. A customized tank can be used for the process according to the invention. The tank can be used in any of the washing, sensitizing or deposition steps. However, it is not necessary that sound signalization be used during the washing and sensitizing. Advantageously, if sound signalization is used in any of the baths, the solution (either the washing solution, sensitizing solution, and/or deposition solution, or deionized water rinse) becomes de-gassed more effectively, and nearly completely if the ultrasound is used.

The tank to be used for those baths including sound signalization is based on an ellipsoidal shape where the hyperbola axis has been extended along Y direction. The tank shape optimizes the reflection of frequency waves (sonic, sub-sonic and ultrasonic frequencies) from the tank walls back toward the material in parallel waves, without changing the amplitude or frequency. Therefore, phase nulling and dead-zones are eliminated. An exemplary ultrasound tank may be one based on an ellipsoid shape of from 45° to 75° ellipsoid, preferably a 60° ellipsoid shape is used.

The material from which the tank is formed can be any appropriate tank capable of withstanding the chemicals used in the process. For example, a glass tank may be used, which is advantageously inert to acid. Further, the tanks may be formed of a polymer, such as polypropylene.

The material transducer (described in more detail below) can be located along the horizontal length of the tank. They may be located under the lip of the tank or at staggered heights above the floor of the tank. The sound vibrations are directed at the material to be metalized and tuned to produce mechanically induced wave sets to the resonance frequency vibration of the specific thread diameters and cross-sectional densities of the material drawn through the autocatalytic processing solutions.

The frequency vibration signalization for the sound transducers is variable and can be tuned according to the material being processed. The requisite variables for appropriate vibration are programmed into the transducers prior to introducing the material into the autocatalytic process, allowing further control over the autocatalytic process of metal deposition.

The tank shape can be customized to reflect sound waves, without changing the amplitude or frequency, through the fluid.

The material and solution transducers are placed within any or all of the washing, sensitizing, rinse and depositional bath tanks, at adjustable levels. The transducers can be vertically and horizontally movable in the tank so as to accommodate fluid in the tank and width of material.

Figures 1, 2A:
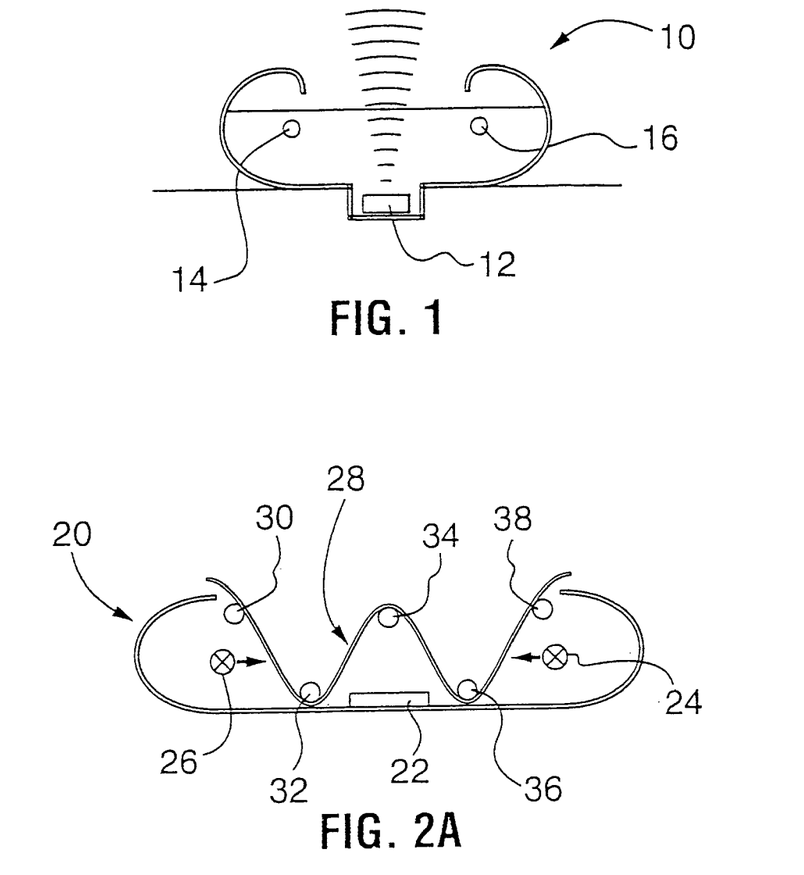
FIG. 1 illustrates a typical tank design in cross-section.
FIG. 2A illustrates an embodiment of a tank having transducers placed therein, and rollers on which a web of fabric material is conveyed through the tank.

FIG. 1 shows a tank (10) according to the invention, in cross-section. The tank has a solution transducer (12) placed at the bottom thereof. Material transducers (14, 16) are placed within the tank, and send sound waves into the tank at the resonant frequency of the material to be metalized.

FIG. 2A illustrates a tank (20) according to the invention with the x-y axis having a parabolically curved shape, whereas the z-axis is linear. Solution transducer (22), material transducers (24, 26) are present within the tank. The material to be metalized (28) rolls through the tank on a series of rollers (30, 32, 34, 36, 38). The tank size may be varied, depending on the size or width of the material to be metalized, or on the fluid capacity desired. The parabolic shape of the tank wall helps reflect all frequency waves from the tank wall back toward the material in parallel waves.

Figure 2B:
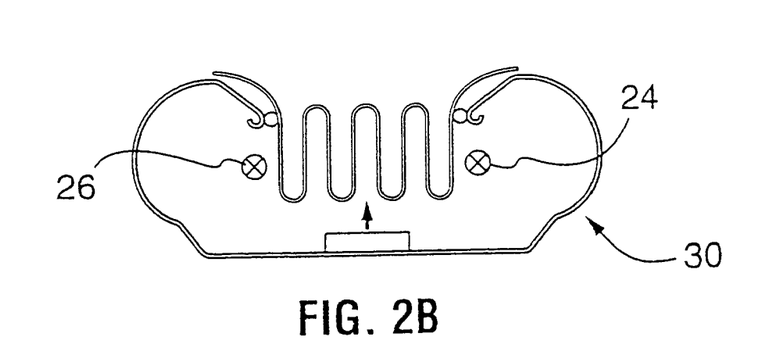
FIG. 2B illustrates an alternative tank embodiment.

FIG. 2B illustrates an alternative tank design (30) with a slightly different placement of rollers and transducers within the tank relative to FIG. 2A. The shape of the lip of the tank is designed to prevent sludge/fluid accumulation on the inside lip of the tank. Transducers (26, 24) are positioned in the sides of the tank to provide material vibration.

Figure 3A:
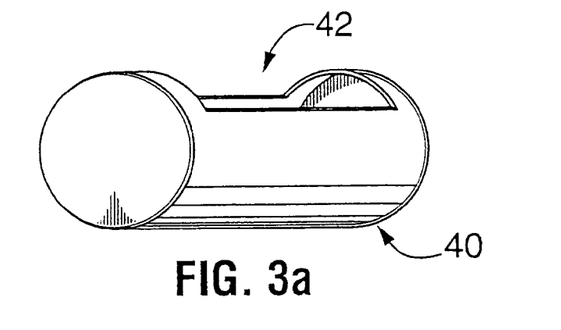
FIG. 3A illustrates a tank design from an exterior perspective view.

FIG. 3A illustrates a perspective view of a tank (40). If a plurality of tanks are to be used in the process according to the invention, they may be placed in a row for ease of operation. However, other configurations may be appropriate. Tanks may be all similar in size or may vary in size through the process. Material enters a tank through a top opening (42).

Figure 3B:
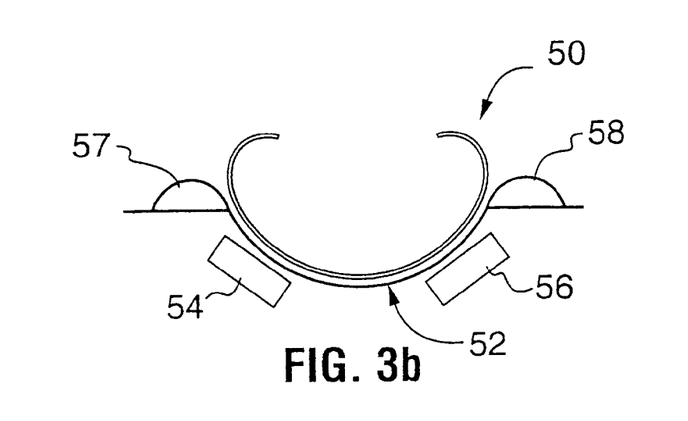
FIG. 3B shows a sectional view of a tank supported on a platform.

FIG. 3B illustrates a tank (50) according to the invention having a platform (52) on which a tank is placed. The tank may be placed on a platform and a platform can have one or more sound array boxes (54, 56). A tank support (57, 58) can be provided to support the tank on either side of the platform.

Figure 4:
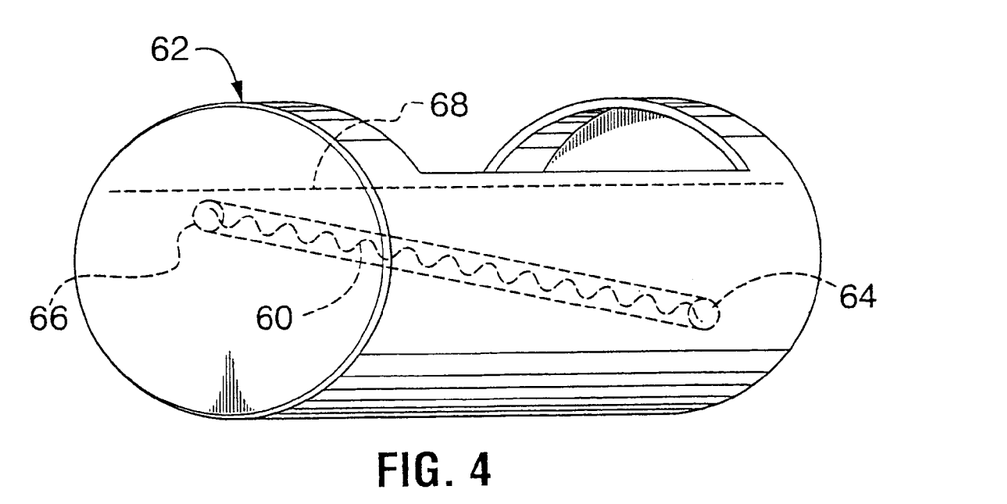
FIG. 4 diagrammatically illustrates the movement of an ultrasound array through a process solution.

FIG. 4 illustrates a sonic signalization array (60) as it moves through solution in the tank (62). The material transducers (64, 66) need not be placed at the same level in the tank below the solution surface (68).

Figure 5A:
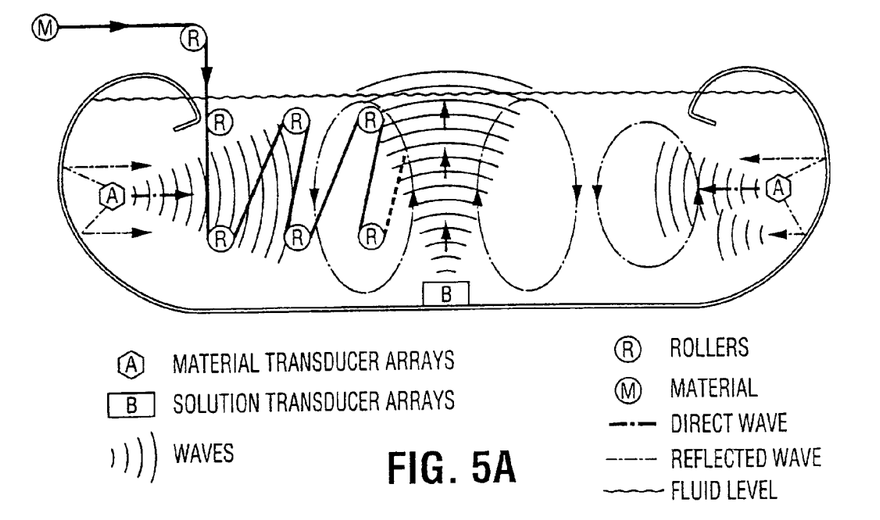
FIG. 5A shows a cross-sectional view of a tank according to an embodiment of the invention, adapted to have a fabric moved therethrough on rollers with an adjustable power train web.

FIG. 5A shows a cross-sectional view of a fabric web moving through a tank according to the invention. The tank is generally cylindrical, thus having a circular cross-section. The fabric (60) is introduced into the tank from a roller, and moves therethrough on a series of rollers, driven by an adjustable power train web. The solution transducer is placed centrally within the tank, below the fluid level. The material transducers are disposed within the sides of the tank. A squeeze roller takes up the fabric and removes excess solution therefrom.

Figure 5B:
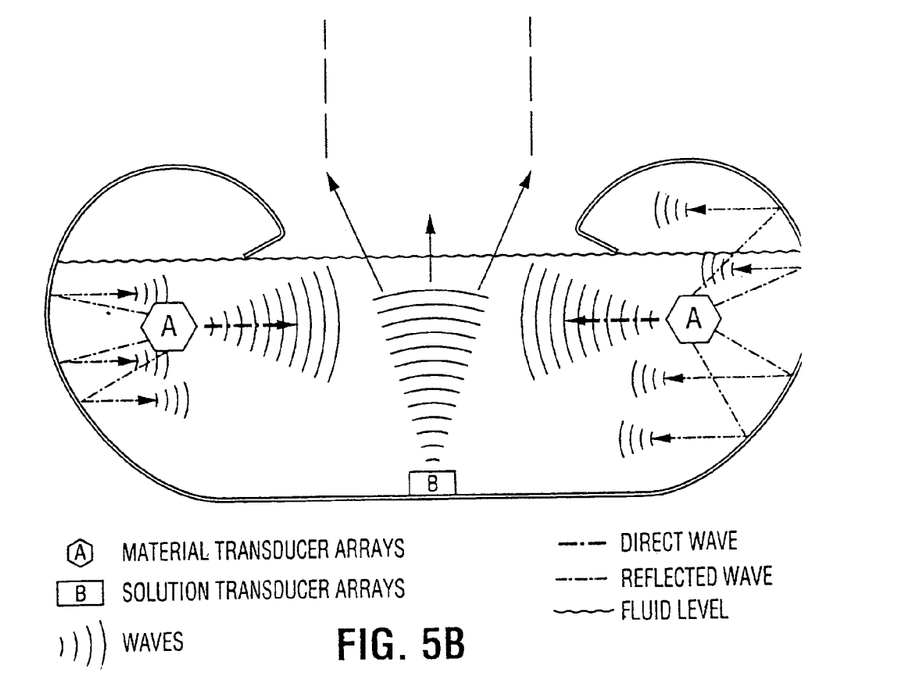
FIG. 5B shows an ultrasonic wavepath directions for material and solution transducer arrays.

FIG. 5B shows an ultrasonic wavepath directions for material and solution transducer arrays.

The Material Transducer. In those tanks which incorporate sound vibrations, transducers are used according to the invention to generate such a vibration. Fixed or variable frequency transducers can be used to stimulate vibration within the tank. Variable frequency tuners allow for fine adjustment so that the resonant frequency can be reached, even if the material changes slightly between runs. The sound vibrations are tuned to produce mechanically induced wave sets to the resonance frequency vibration of the material. This frequency is dependent on a number of factors such as the thread diameters, if a fabric is used, or the knit or density of the material immersed in or drawn through the autocatalytic processing solutions.

The material transducer is responsible for creating vibrations which in turn cause a constant movement of the material on which the metal is to be deposited. Because the material is in constant motion within the deposition bath, the metal ions in solution have greater exposure, to all surfaces of the material. For example, when the material is a woven nylon, all threads within the weave vibrate at the resonance frequency. Thus, the threads that are adjacent to each other in the material have a greater likelihood of becoming fully individually coated with metal, relative to prior art plating methodologies that do not induce movement in the material to be plated. Because the frequency at which the material will reach resonance frequency is variable, depending on the properties of the material, the sound frequency can be made adjustable within a bath, so as to accommodate differences between batches, or to make adjustments when materials are changed.

The sound waves may be produced as a variable frequency wave anywhere from 1 to 2000 kHz, or preferably, from 5 to 150 kHz, or may be a variable pulse vibration, having a sine wave, square or sawtooth shape. The wave may or may not be pulsed. Any type of vibration that causes turbulence within the solution contained in the tank may be emitted by the solution transducer. Low frequency waves, for example at the low end of the sub-sonic range, can be amplified to transmit high power waves in denser solutions that are more viscous. Denser solutions may require more energy to transmit vibration. The sound frequency vibration signalization is variable and can be tuned according to the material being processed. These variables effecting the vibration signalization include pulse width, pulse amplitude, pulse polarity and repetitive pulse frequency. The shape of the wave and slope variables of the pulses are not limited, and can be sinusoidal, sawtooth or square wave. The above variables are selected according to the specific properties of the material passing through the autocatalytic solution. The variables can be programmed into the transducers prior to introducing the material into the autocatalytic solutions, thereby allowing further control over the autocatalytic process of metal deposition.

The ultrasound transducers are placed within the autocatalytic solution, and optionally any of the other baths. The transducers may be placed in the tank at adjustable levels, dependent upon the fluid level in the tank. The transducers may be of the type that can move vertically and/or horizontally in the tank, so as to accommodate fluid in the tank and width of material.

Solution Transducer. Along with the vibrations introduced into the tank at the material resonance frequency, a second vibration is introduced at a sound frequency ranging from sub-sonic (about below 20 kHz), sonic (about 20 kHz), ultrasonic (from about 20–100 kHz), or beyond ultrasonic (2000+kHz). This vibration is introduced into the tank by a second transducer, or a "solution transducer". This vibration is generated and tuned to produce mechanically induced wave sets at the resonance frequency of vibration characteristic of the solution bath in which it is present. Vibrations produced by the solution transducer create laminar mixing through convective currents within a solution, thereby encouraging mixing through low frequency waves. The waves may be pulsed or sine wave vibrations, depending on the desired amount and type of convection currents to be introduced into the tank.

The solution transducer is used in the deposition step, that is, in the autocatalytic process, and may optionally be used in the washing and sensitizing steps, as well as in any of the rinse baths. This vibration is pulsed in a non-parallel direction to the first ultrasonic frequency vibration in order to induce a convection current flow through the fluid, or may be induced as a square-shaped sine wave. Optimally, the vibration is pulsed in a nearly perpendicular direction to the material vibration. According to an embodiment of the invention, a "sound cone" is created within the tank, for example, vibrations emanate from the bottom of the tank and are emitted directly out of the surface of the solution within the tank. In this way, the vibrations are not returned to the tank, because there is no reflection of the vibration from the tank sides. The sound cone effect can be created by attending to appropriate placement of the transducer within the tank.

This second wave set promotes turbulence within the solution, allowing an even solution mixture and effective de-gassing the solution. By inducing a convection current flow through the fluid, an even solution mixture and total de-gassing of a solution is promoted.

The solution vibrations are generated from one or more directional transducers disposed within the tank, which are herein referred to as a "set" of transducers, which encompasses the possibility of only having one transducer. Optionally, the transducers introducing this second wave set may be permanently or temporarily secured to the bottom of the tank, disposed directly below the tank top opening. When vibrations are generated from the second set of transducers, they move up through the tank and move out into the air with little to no vibration reflection. The material frequency vibrations are in a direction non-parallel to the solution frequency vibrations, so that waves will not be nullified, nor additive.

The solution transducer can be tuned to the fluidic frequency of resonance vibration, and amplitude can be adjusted at that frequency to increase the power of the vibration. An increase in power with the solution transducer could have the effect of creating greater convective currents and increasing mixing. The shape of the tank can be taken into consideration when setting the parameters of the solution transducer.

Sensors. Optionally, sensors may be used within any or all tanks so as to allow ongoing evaluation of fluid chemistry, temperature, or other conditions effecting the process. Sensors may be present in a bath to detect such parameters as temperature, pH, concentration of chemicals present in a given bath, particularly the metal ion of interest, fluidic density, conductivity, resistance, pressure, and the presence of any null points within the tank. A sensor may be placed in such a way that the conductivity of the material can be measured. In this way, the process can be regulated so as to finish the deposition step when the appropriate pre-determined conductivity level is reached.

An embodiment of the invention pertaining specifically to applying a silver deposition on a non-conductive surface is delineated below. This embodiment consists of a cleaning step in which the non-conductive surface is immersed in an aqueous or non-aqueous based cleaning solution, preferably utilizing ultrasonic agitation set at the frequency of the material. The cleaning step is followed by an activation step during which the surface is activated or "sensitized" with an aqueous sensitization solution. For applications pertaining to nylon, the sensitization solution may contain tin(II) ions in an amount of from about 0.05%–5.0%, preferably at about 1.0%, with ultrasonic agitation. A deposition step (or "plating" step) is then conducted in which silver is deposited on the surface by immersion in a deposition solution having a pH of about 9 to 11, preferably about pH 10 and containing a silver(I) salt such as silver nitrate. During the immersion in the deposition solution, two sound waves are induced in the solution, one set at the frequency of the material being plated, for example, 20–150 kHz, the other set perpendicular to the first and at the resident frequency of the plating solution, for example, 5–150 kHz. A reducing agent selected from formaldehyde, hydrazine sulfate, hydrazine hydrate, glucose, and hypophosphoric acid is added in a concentration sufficient to reduce the silver to metallic form, and a stabilizing agent selected from ammonium hydroxide, sodium acetate, sodium hydroxide and sodium citrate is added in sufficient concentration to prevent the reduction of silver(I) ions spontaneously in the plating solution. An anionic surfactant, such as ammonium or sodium lauryl sulfate, is added to the deposition solution in sufficient concentration so as to meet the critical micelle concentration of the surfactant and permit deposition of the silver onto the surface. The two sound waves moving through the plating solution promote the uniform deposition of silver onto the material surface during the deposition step.

The metal deposition method according to the invention contributes to a controlled and uniform deposition rate of metallic ions onto material drawn through the autocatalytic deposition solution, and the controlled depletion rate of the autocatalytic medium. The use of variable/fixed frequency sound signalization allows regulation of the distribution and amount of metal deposited on a material, and thus allows control of the conductivity of the material. Metals can be deposited on material to create a consistent impedance/resistivity level in the range of 1000, 600, 300, 10 ohms to milli-ohm, micro-ohm levels and conductivity ranging from amps to micro-amps can be used in order to achieve desired amount of deposition for a particular application.

Industrial Applications

The process is useful in such aerospace applications as electromagnetic interference (EMI), electromagnetic pulse (EMP), electrostatic discharge (ESD), aerospace microwave protection, avionics, static dissipation for such applications as fuel tanks or fuel filling hoses, lightening strike protection, shielding of keel beam and fuselage components of aircraft, aerospace thermal shielding, and other types of specialized fabric shielding, and for medical applications, such as medical topical wound care dressings and medical shielding.

An exemplary application of the invention is the use of silverized aramid materials in the aerospace industry. Silverized aramid materials may be considered a 'derivative' of the existing aircraft components and thus may be able to share the same type of certificate awarded to the original design, saving the manufacturer most of the delay and expense of certifying the additional airworthiness. Silverized aramid materials provide commonality among existing aircraft parts, thus allowing vehicle manufactures to realize significant economics of scope in storage and handling of this material, in training of people in the production line, inventory management, and ease in maintenance and repair. Further, silverized aramid maintains its inherent properties, such as compressive strength.

The ability to control the conductivity of the material, through varying the amount of silver deposited on the material, enables customized shielding for EMI (electromagnetic interference) and RFI (radiofrequency interference), and to protect electronic components of aircraft. The invention can be used to produce shielding of EMP (electromagnetic pulse). Further, the invention can provide shielding for cables, such as co-axial cables, or for antennae. Shielding of boxes for containing sensitive components may also be conducted according to the inventive process.

Electrostatic discharge is defined as the transfer of charge between bodies at different electrical potentials. Electrostatic charge is most commonly created by the contact and separation of two similar or dissimilar materials. Electrostatic discharge can change the electrical characteristics of a semiconductor device, degrading or destroying it. Electrostatic discharge also may upset the normal operation of an electronic system, causing equipment malfunction or failure. Electrostatic discharge can result in igniting flammable mixtures and/or damage electronic components within the aircraft. Damage from electrostatic discharge can cause catastrophic failure or a latent defect, which is difficult to identify. A device that is exposed to an ESD event may be partially degraded, yet continue to perform its intended function. However, the operating life of the device may be reduced dramatically. Damage can result from direct electrostatic discharge to the device, electrostatic discharge from the device or field induced discharges. Presently, components are protected for ESD events through shielding composed of metal, such as copper foil. A material autocatalytically coated with silver according to the inventive process described herein has comparable static bleed away from key electronic components and off helicopter rotor tips, and has the added advantage of being lightweight and does not work harden.

There are many sources of static electricity on aerospace vehicles. It is paramount to protect electronic components in aerospace vehicles from an electrostatic discharge (ESD) event. The use of metalized material formed according to the invention on helicopter rotor blades results in electrostatic bleed which prevents particles being ionically charged and causing fluorescence which can interfere with night vision equipment.

Customized avionics shielding can be accomplished using the inventive process. Aerospace components metallized according to the invention enable customized shielding for microwave absorption, lightning strike protection, or shielding keel beam and fuselage components. At the present time expanded copper foil is used to shield personnel from microwave radiation. The invention can promote static dissipation, for example on fuel tanks or fuel filling hoses, by metalizing such components according to the invention. Components such as keel beams or helicopter components can be metalized according to the invention.

Components metallized according to the invention can be used for thermal and infrared radiation shielding. Thermal and infrared radiation are generated whenever energy is generated or absorbed in the aircraft, for example by the engine. The natural malleability of silver combined with a flexible material allows for a heat generating component to be shielded in a variety of different ways. A silver drape can be pulled around or draped over a generating source. The silver material can be incorporated into a composite component or molded into a rigid shielding frame. Thermal signature reduction is an important component for stealth technology in military low observability aircraft.

Solar radiation dissipation is very important in aerospace components. Space station modules are presently composed of an inner layer of waffle-patterned aluminum for hull strength, covered by an insulation blanket. The next layer is an intermediate debris shield composed of a material similar to Kevlar™. Finally, an aluminum debris shield is placed over the intermediate debris shield for added protection and to reflect intense sunlight to reduce the load on the air conditioning system of the space station. Metalized components formed according to the invention can be used in place of the exterior aluminum debris shield. This layer would provide compatibility with the inner layers, lowering the likelihood of metal corrosion and providing the thermal dissipation required.

Conventional chaff is released behind military aircraft and floats behind the aircraft creating a multi-target blanket to confuse weapons directed at the aircraft, or for directional jamming of seeking weapons. Conventional chaff is composed of aluminum ribbon foil, which may pollute the environment once it hits the ground, and may be toxic if consumed by domestic and wild animals. Biodegradable flakes uniformly deposited with silver is a lightweight alternative to aluminum ribbon foil. When dispersed into the air the flakes will float to the ground and dissolve within days.

Existing biological warfare/outbreak protective garments are heavy, bulky and difficult to manoeuver. Dependent upon weather conditions, the protective garments can be worn for only a limited time due to possible heat exhaustion. Uniformly coated silver fabric can be incorporated into biological warfare/outbreak protective garments to create a flexible and light-weight suit, while maintaining anti-bacterial protection for personnel. Uniformly coated silver fabric incorporated into biological warfare protective breathing apparatus will provide light weight anti-bacterial/fungal/biological protection for personnel. If the biological warfare protective garment is pierced, and the individual is wounded, a uniformly coated silver fabric provides first-response topical treatment at the wound site.

The invention can be applied to formation of custom shielding items such as drapery, composite material, tent material, for military or police personnel armour. Uniformly coated metalized fabric, such as silver-coated fabric, can be molded or formed into complex shapes without tearing or work hardening because silver is a malleable metal and is thinly and uniformly deposited onto a flexible material. Silver coated aramid fabric and nylon can also be used in body armour as protection from physical incapacity resulting from electrical pulse exposure, such as stun weapons. Water filter systems incorporating uniformly coated silver fabric can be used to kill bacteria on flow through contact. Silver fabric incorporated into air filtering systems can be used in hospital, or military facilities, for example in isolation wards or where the danger of contagion is high.

The use of silverized nylon, where the silver ions have been deposited to the nylon according to the process described herein, is appropriate for anti-bacterial protection when placed in direct contact with wounds such as traumatic wounds (e.g. abrasions, punctures, avulsions and partial thickness burns), surgical wounds (e.g. surgical procedures, incisions, central line placements, peripheral IV placements, ostomy and tracheotomy sites, orthopedic external fixation pins), chronic wounds (e.g. pressure ulcers, yeast and bacterial infections), and other types of wounds that result in an opening in an epidermal layer.

The silver fabric produced using the inventive process is ideal for incorporation into pressure garments. These garments may be used in scar management to significantly reduce scarring and accelerate healing, or for blood-pressure control. This is applicable for burn scar management, hypertrophic scar management, plastic surgery scar management, and dermatological scar management. Silver fabric (thread) can be incorporated into these garments in order to prevent the growth of bacteria or fungus such as socks, shoe liners, long underwear, male and female underwear, feminine personnel hygiene material, or acne masks. Silver fabric (thread) can also be incorporated into garments that can be worn as flexible armour providing anti-bacterial and anti-fungal protection and first response topical treatment for wound penetration. Silver fabric (thread) can be incorporated into veterinary wound care products, of which include horse blankets; pressure wrap bandages, udder gloves, etc.

EXAMPLES

The following examples illustrate the inventive process used in a variety of applications. However, the examples are in no way limiting to the scope of the invention.

Example 1

Sound Wave Ion Stimulation for Autocatalytic Deposition of Silver onto Aramid and Aramid-Type Fibres at Resonant Frequency Vibration Data was collected using raw woven Kevlar™ and Zylon™ samples, and molded nylon in order to illustrate the inventive process.

The development and testing of the inventive process for coating silver on woven Kevlar™ involved three stages: 1) determining an appropriate methodology for autocatalytic deposition of silver on woven Kevlar™; 2) determining whether the basic properties of strength and flexibility were retained in the silverized Kevlar™; and 3) comparing the conductivity of the silverized Kevlar™ with that of copper foil. Experiments were conducted under controlled laboratory conditions. These experiments illustrated the successful silverizing of woven Kevlar™ according to the invention.

Sensitized material was set in motion perpendicular to the motion of the silver solution, which in turn was actively set in motion by a second alternating phase shifted frequency at resonant vibration frequency. The resonant frequency was determined visually by the vibrational movement of the material. Consequently, the two mediums were put in a constant control flow toward each other. This eliminated depletion zones within the autocatalytic solution. Thus, when the sensitized material was drawn through the silver solution, a constant deposition of silver was applied to the material.

A customized ellipsoidal tank was used based on a 60° ellipsoidal shape, having the hyperbola axis extended along Y direction. The ellipsoidal shape of the tank was used to optimize the reflection of frequency waves (sonic, sub-sonic and ultrasonic) from the tank walls back toward the material in parallel waves, without changing the amplitude or frequency. Therefore, phase nulling and dead-zones were eliminated.

The material transducers were located along the horizontal length of the tank. They were placed under the lip of the tank at staggered heights above the floor of the tank. The ultrasound vibrations were directed at the Kevlar™ fibers and were tuned to produce mechanically induced wave sets to the resonant frequency vibration of the specific thread diameters and cross-sectional densities of the material drawn through the autocatalytic processing solutions.

Perpendicular to this first set of vibrations was another sound frequency vibration tuned to produce mechanically induced wave sets at the resonance frequency vibration of each of the solution baths used. This ultrasound vibration was perpendicularly pulsed to induce a convection current flow through the fluid. This allowed an even mixing of the solutions and appeared to result in total de-gassing of the solutions. These vibrations were generated from a set of directional sound transducers which were permanently secured to the bottom of the tank, and located directly below the tank opening. When the vibrations were generated, they moved up through the tank and out into the air with little vibration reflection. In this case, both the resonant frequency of the material and of the solution were in the ultrasonic range.

A controlled depletion rate of silver from the autocatalytic medium resulted.

The following process steps were used to coat Kevlar™ with silver. The material was weighed, and the amounts of chemicals required to be mixed in each bath were calculated according to conventional autocatalytic formula. Silver of 99.9999% purity was used. All other chemicals used in the process were also of high purity.

Silver was deposited onto the Kevlar™ surface, which is a non-conductive surface, consistent with the invention. The Kevlar™ fabric was placed on a roller conveyor system for moving through the processing baths. A sound signalization unit was installed in each processing bath (washing, rinsing, sensitizing and deposition baths) and was tuned to vibrate the specific material at its predetermined specific resonant vibration frequency. All transducers were liquid cooled.

The process involved cleaning the surface in aqueous cleaning solution utilizing ultrasonic agitation set at the resonance frequency of the material, followed by activation (sensitization) of the surface with an aqueous activating solution containing 1% tin(II) ions with similar ultrasonic agitation. Silver was then deposited on the surface by immersion in a deposition solution having a pH of 10 and containing a silver(I) salt, particularly, silver nitrate. The deposition bath had two ultrasonic waves vibrating therethrough, one set at the resonance frequency of the material, the other set perpendicular to the first and at the resident frequency of the deposition solution. Formaldehyde was added as a reducing agent to reduce the silver to metallic form. Ammonium hydroxide was added as a stabilizing agent to prevent the reduction of silver(I) ions spontaneously in the deposition solution. Sodium lauryl sulfate was added as an anionic surfactant.

The fabric was first drawn into a surfactant bath for cleaning. The material remained in the surfactant bath for 10 minutes. Material was then removed from the surfactant bath and was immediately passed through a pressure squeeze roller to remove excess surfactant from the material. The material was drawn through a deionized rinse bath in which the ultrasound waves correspond with the resonant vibration frequency of the material.

The material was drawn through a pressure squeeze roller mechanism after the rinse bath in order to strip an electron from the surface of the material. The material was submerged in a solution of methanol and dimethyl sulfoxide (1 to 10 ratio) with a continuous argon gas flow through a closed container. To this solution was added an equal amount of potassium tert-butoxide in grams as the methanol. The material remained in this solution until it changed from pale yellow to bright orange.

The material was then drawn into a sensitizing bath. The time it remains in the bath is dependent on the weight of the material and the amount of metal to be deposited. The sound signalization was used in this bath to ensure that a constant coherent solution mixing occurred, thus eliminating any depletion zones. The ultrasound also had the effect of de-gassing the material and the sensitizing solution in order to avoid voids. The repetitive pulse rate and magnitude of the pulse width and amplitude were set to optimize the rate of mixing.

The Kevlar™ material was then drawn out of the sensitizing bath and passed through a pressure squeeze roller and into several rinse DI baths. In each rinse bath the sound signalization was set to vibrate at the frequency of the material, which de-gassed the material and the rinse water.

The chemical composition of the solution used is in the public domain. Briefly, silver nitrate was dissolved in DI water. Ammonia hydroxide was then added to the silver nitrate mixture until the reaction changed from brown to clear. The material was drawn into the silver autocatalytic solution. The sound waves in the bath were set to correspond with the resonant vibration frequency of the material. A sound frequency was produced with a positive pulsed wave, in a sinusoidal form, which was directed such that a physical current flow was induced in the solution. This combination of pulses induced current flow ensured constant mixing, and eliminated depletion zones.

The material was rinsed in a DI bath to remove all excess metallic solution. The ultrasound waves in the DI bath correspond with the resonant vibration frequency of the material. The material was then passed through pressure squeeze rollers and finally through pressure suction rollers and dried using warm air. The finished material was spooled onto storage spools in preparation for packaging.

Example 2

Coating Nylon Bandages with Silver Ions for Use as Medical Topical Wound Care Dressings The following process steps were used to coat nylon with a uniform layer of 20% silver by weight. The material was weighed (10.0 g), and the chemical requirements for each bath were calculated according to standard formulae. Silver of 99.9999% purity was used. All other chemicals used in the process were of high purity. The fabric was placed on a continuous roller conveyor system for moving through the processing baths.

Sound signalization units were installed in each processing bath (cleaning, rinse, sensitizer and depositional) and were set to vibrate at the specific resonant vibration frequency of the particular material, as determined visually by the degree of vibration of the material. All transducers were liquid cooled.

The material was first drawn into a surfactant bath for cleaning. The nylon was agitate in a 0.375% aqueous solution of Triton X-100 for 10 minutes.

The material was removed from the surfactant bath and immediately passed through a pressure squeeze roller to remove all excess surfactant from the material. The material was then drawn through a deionized water rinse bath in which the sound signalization waves corresponded with the resonant vibration frequency of the material.

The material was drawn through a pressure squeeze roller mechanism after each rinse bath, and then drawn into a sensitizing bath. The nylon was sensitized by immersion and ultrasonic agitation in a solution of 4 grams per liter of aqueous stannous chloride having a pH of 1.0 at 25° C. for 10 minutes. The bath volume was calculated by estimating that 10 g of fabric requires about 250 mL of sensitizing solution.

The sound waves in the bath corresponded with the resonant vibration frequency of the material. A negative pulsed wave having an ultrasound frequency in a square form was directed such that a current flow was induced in the solution. The repetitive pulse rate and magnitude of the pulse width and amplitude controlled the rate of mixing, eliminating any depletion zones. The sensitizer solution composition was dependent on the material.

The material was drawn out of the sensitizing bath and passed through a pressure squeeze roller and into several rinse DI baths.

In each rinse bath, the material transducer was set to a frequency consistent with the resonance frequency of the material, as determined visually, thereby promoting degassing of the material and the rinse water. The material was drawn into the autocatalytic solution. The material sound waves in the bath corresponded with the resonant vibration frequency of the material. A second sound wave, produced by the solution transducer was a negative pulsed wave, in a square form was directed such that a physical current flow was induced in the solution. The repetitive pulse rate and magnitude of the pulse width and amplitude controlled the rate of mixing.

The silver autocatalytic solution chemical composition is in the public domain. Specifically, the solution was prepared as follows. Silver nitrate was dissolved in DI water. Ammonium hydroxide was added to the silver nitrate mixture until the reaction changed from brown to clear. The material transducer was set at the resonant frequency of the material.

Surfactant and then all of the silver nitrate mixture was added into an autocatalytic bath tank. The perpendicular ultrasound wave was set at the resonant frequency of the solution. The sensitized material was placed into the surfactant bath. The two sound waves moving through the solution promoted the deposition of the silver onto the nylon surface. Slowly, the formaldehyde was added to the silver solution bath. The deposition was conducted at 30° C.

The nylon was then rinsed in a DI bath to remove all excess metallic solution. The sound waves in the bath corresponded with the resonant vibration frequency of the nylon material. The material was then passed through pressure squeeze rollers and finally through pressure suction rollers and dried using warm air. The finished material was spooled onto storage spools in preparation for packaging.

The product produced by the process described herein permitted a quality assurance such as materials meeting medical grade standards of silver (99.9999% pure) when applied to organic and inorganic fabric or film material based medical dressings meeting 510 k FDA class 1,2,3 medical devices and Health Canada requirements for Class 1, 2 and 3 medical devices.

This flexible silverized material was placed in direct contact with wound tissue, resulting in an electrical potential gradient between the wound tissue and the silverized material. This gradient resulted in silver ions migrating from the silverized material into the body tissue. Animal tissue biopsies of wound sites (after 7 days) indicated that silver ion penetration was less than 3 mm, and blood samples collected concurrently show no silver ions in the blood system. The silverized material in direct contact with the wound surface creates an anti-bacterial/anti-fungal wound environment which in turn promoted faster wound healing as compared to conventional wound dressing.

The above-described embodiments of the present invention are intended to be examples only. Alterations, modifications and variations may be effected to the particular embodiments by those of skill in the art without departing from the scope of the invention, which is defined solely by the claims appended hereto.

What is claimed is:

1. An autocatalytic process for depositing a metal on a material comprising the steps of:
    washing the material;
    sensitizing the material;
    after the washing and sensitizing immersing the material in an autocatalytic deposition solution comprising the metal;
    inducing a material vibration in the autocatalytic deposition solution at a resonance frequency of the material from 5 kHz to 150 kHz;
    inducing a solution vibration in the autocatalytic deposition solution in a direction perpendicular to the material vibration, to deposit a controlled and substantially uniform thickness of the metal onto the material while both the material and the solution vibrations are occurring; said solution vibration being at a resonance frequency of the autocatalytic deposition solution.

2. The autocatalytic process according to claim 1, wherein a material vibration and a solution vibration are induced in the washing step or the sensitizing step.

3. The autocatalytic process according to claim 1, wherein a predetermined thickness of metal is deposited on the material.

4. The autocatalytic process according to claim 1, wherein the material is selected from the group consisting of nylon, aramid fibers, polymeric material, polymeric composites, graphite, fiberglass, organic fibers, and mixtures thereof.

5. The autocatalytic process according to claim 1, wherein the metal is silver, tin, gold, platinum, copper, cobalt, palladium, cadmium, nickel, titanium, or zinc.

6. The autocatalytic process of claim 1 wherein the material comprises a fabric bandage and the metal is silver.

7. The autocatalytic process of claim 1 wherein the material comprises a component of an aerospace vehicle.

8. The autocatalytic process of claim 1 wherein the resonance frequency of the material is 20 kHz or greater.

9. An autocatalytic process for depositing a metal on a textile material comprising the steps of:
    washing the textile material;
    immersing the textile material in a low pH sensitizing bath;
    inducing a material vibration in the sensitizing bath at a resonant frequency of the textile material from 5 kHz to 150 kHz;
    after the washing and the sensitizing immersing the textile material in an autocatalytic deposition solution comprising the metal;
    inducing a material vibration in the autocatalytic deposition solution at a resonant frequency of the textile material from 5 kHz to 150 kHz; and
    inducing a solution vibration in the autocatalytic deposition solution at a resonant frequency of the autocatalytic deposition solution, in a direction perpendicular to the material vibration, to deposit a controlled and substantially uniform thickness of said metal onto the textile material; while both the material and the solution vibrations are occurring
    wherein said metal is silver.

10. The autocatalytic process of claim 9 wherein the resonant frequency of the textile material is 20 kHz or greater.

11. An autocatalytic process for depositing a metal on a material comprising the steps of:
    immersing the material in an autocatalytic deposition solution comprising the metal, said autocatalytic deposition solution being contained within a tank having side walls, a bottom, and an ellipsoidal cross-section;
    inducing a material vibration in the autocatalytic deposition solution at a resonance frequency of the material from 5 kHz to 150 kHz; said material vibration originating from a side wall of the tank;
    inducing a solution vibration in the autocatalytic deposition solution in a direction perpendicular to the material vibration, to deposit a controlled and substantially uniform thickness of the metal onto the material while both the material and the solution vibrations are occurring; said solution vibration being at a resonance frequency of the autocatalytic deposition solution; and said solution vibration originating from the bottom of the tank.

12. The autocatalytic process of claim 11 wherein the material is conveyed through the tank on rollers.

13. The autocatalytic process of claim 11 wherein the resonance frequency of the material is 20 kHz or greater.

* * * * *